United States Patent
Wu et al.

(10) Patent No.: US 6,534,783 B1
(45) Date of Patent: Mar. 18, 2003

(54) STACKED MULTIPLE QUANTUM WELL SUPERLATTICE INFRARED DETECTOR

(75) Inventors: Chan-Shin Wu, Torrance, CA (US); Cheng P. Wen, Mission Viejo, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/819,186

(22) Filed: Nov. 15, 1993

Related U.S. Application Data

(63) Continuation-in-part of application No. 07/457,613, filed on Dec. 27, 1989, now Pat. No. 5,077,593, and a continuation of application No. 07/792,511, filed on Nov. 12, 1991, now abandoned.

(51) Int. Cl.[7] .............................................. H01L 29/06
(52) U.S. Cl. .......................... 257/21; 257/184; 257/440
(58) Field of Search ........................ 257/21, 26, 184, 257/189, 440, 443, 447, 448

(56) References Cited

U.S. PATENT DOCUMENTS

| 4,250,516 A | * | 2/1981 | Worlock .................... 351/30 A |
| 4,598,164 A | * | 7/1986 | Tiedje et al. ................ 136/249 |
| 4,731,641 A | * | 3/1988 | Matsushima et al. ...... 357/30 A |
| 4,755,860 A | * | 7/1988 | Aiiam et al. .............. 357/30 A |
| 5,059,786 A | * | 10/1991 | Chu ......................... 250/338.4 |
| 5,077,593 A | * | 12/1991 | Sato et al. ..................... 357/30 |
| 5,296,720 A | * | 3/1994 | Wen et al. ..................... 257/21 |

FOREIGN PATENT DOCUMENTS

| JP | 61-170079 | * | 7/1986 | ............... 357/30 A |
| JP | 1-129476 | * | 5/1989 | ................... 257/21 |

* cited by examiner

*Primary Examiner*—Sara Crane
(74) *Attorney, Agent, or Firm*—William C. Schubert; Glenn H. Lenzen, Jr.

(57) ABSTRACT

A radiation detector, particularly suited for the detection of long wavelength infrared radiation, employs a plurality of multiple quantum well (MQW) superlattices in a unitary stack. The superlattices are electrically connected in parallel, and current outputs are obtained from the parallel connection as an indication of the incident radiation. Electrical contact layers are provided on the opposite sides of each superlattice, with adjacent superlattices sharing a common contact layer. The number of quantum well/barrier layer periods per superlattice is preferably reduced to about 20–30 divided by the number of superlattices in the stack, as compared to a single-superlattice detector with about 20–30 periods. This allows a common bias voltage applied to the superlattices to be similarly reduced by a factor approximately equal to the number of superlattices in the stack. The reduction in superlattice thickness and bias voltage yields a higher external quantum efficiency, improved signal-to-noise ratio and lower power consumption. The detector can be implemented either as a single color system with similar superlattices, or as a multi-color system in which each superlattice is tuned to a different radiation waveband.

19 Claims, 2 Drawing Sheets

STACKED MULTIPLE QUANTUM WELL SUPERLATTICE INFRARED DETECTOR

This is a Continuation-in-part of application Ser. No 07/457,613, filed Dec. 27, 1989, now U.S. Pat. No. 5,077,593, granted Dec. 27, 1991. This is a continuation of application Ser. No. 07/792,511, filed Nov. 12, 1991 and now abandoned.

BACKGROUND OF THE INVENTION

1. Field of the Invention

This invention relates to the detection of electromagnetic radiation with a multiple quantum well (MQW) superlattice structure, and more particularly to the sensing of long wavelength infrared radiation (LWIR) with an MQW superlattice in which photoexcited charge carriers are transported through the superlattice under the influence of an applied bias voltage.

2. Description of the Related Art

MQW superlattice LWIR detectors made of heterojunction materials, such as GaAs/GaxAll xAs, provide good design flexibility for spectral response. The detection of LWIR with an MQW sensor has been reported in several publications, such as Levine et al., "Bound-to-Extended State Absorption GaAs Superlattice Transport Infrared Detectors", *J. Applied Physics Letters*, Vol. 64, No. 3, Aug. 1, 1988, pages 1591–1593; Levine et al., "Broadband 8–12 μm High-Sensitivity GaAs Quantum Well Infrared Photodetector", *Applied Physics Letters*, Vol. 54, No. 26, Jun. 26, 1989, pages 2704–2706; Hasnain et al., "GaAs/AlGaAs Multiquantum Well Infrared Detector Arrays Using Etched Gratings", *Applied Physics Letters*, Vol. 54, No. 25, Jun. 19, 1989, pages 2515–2517; Levine et al., "High-Detectivity $D^*=1.0 \times 1.0^{10}$ cm $\sqrt{Hz}/W$ GaAs/AlGaAs Multiquantum Well $\lambda=8.3$ μm Infrared Detector", *Applied Physics Letters*, Vol. 53, No. 4, Jul. 25, 1988, pages 296–298.

The principal of operation for an MQW superlattice IR detector is illustrated in FIG. 1. The basic device consists of a periodic heterostructure of GaAs quantum wells 2 and AlGaAs barrier layers 4. The GaAs quantum well layers are doped with an n-type dopant, such as silicon, to provide electrons in the ground states of the wells for intersubband detection. The superlattice is sandwiched between a pair of heavily n-doped GaAs contact layers 6 and 8, with contact layer 6 functioning as an electron emitter and contact layer 8 as an electron collector during sensor operation. Ohmic contacts 10 and 12 on the opposed contact layers provide access to apply a bias voltage across the superlattice.

The thickness of each quantum well layer 2 is sufficiently small, generally about 20–60 Angstroms and most preferably about 40 Angstroms, that quantum effects are significant. The thickness of each barrier layer 4 is generally about 40–300 Angstroms, and most preferably about 140 Angstroms. The superlattice period is thus preferably about 180 Angstroms. It is generally preferred that the superlattice have about 20–30 periods. GaAs quantum well layers 2 are heavily doped n-type with a donor impurity such as Ge, S, Si, Sn, Te or Se. A particularly preferred dopant is Si at a concentration of about $1 \times 10^{18}$–$5 \times 10^{18}$ cm$^3$, and most preferably about $2 \times 10^{18}$ cm$^{-3}$. Lattice match and thermal coefficient considerations, impurity concentrations and fabrication techniques are known in the art.

Although a GaAs/AlGaAs superlattice is preferred, other materials may also be used. For example, it may be desirable to use materials such as InGaAs/InAlAs on InP, SiGe on Si, or HgCdTe. In general, superlattices fabricated from III–V, IV–IV and II–VI semiconductor materials are suitable. The MQW superlattice detectors are particularly suited for the detection of LWIR, but the sensors in general are applicable to the detection of radiation and other wavelength regimes, and no limitation to LWIR for the present invention is intended.

The potential energy barrier height of the barrier layers 4 is about 160 mev above the potential energy barrier height of the quantum wells 2 for GaAs/AlGaAs. For LWIR with peak detection of about 12 microns, the energy gap between the bound state and the excited state for electrons in the quantum wells is about 100 mev, with the first electron excited state in the quantum wells lying above the conduction band edge of the barrier layers.

Incident infrared photons excite electrons from the quantized baseband of the wells to extended excited states in a continuous conduction subband, which has an energy level greater than the conduction band floor for the barrier layers. The excited electrons are then accelerated towards the collector contact 8 by an electric field created by an externally applied bias voltage source $V_b$. Under normal sensor operating conditions, the bias voltage causes the mean-free path of electrons in the subband 8 to be sufficiently large for the electrons to travel under the applied field through the superlattice, producing a photocurrent that is measured as an indication of the magnitude of incident radiation. An ammeter 14 can be inserted in the circuit between contact layers 10 and 12 for this purpose.

The sensitivity of an MQW superlattice infrared detector can be severely limited by high levels of dark current. This current consists primarily of electrons which tunnel through the intervening barrier layers 4 between the ground states of adjacent quantum wells 2. The tunneling current can be reduced by increasing the widths of the barrier layers 4. However, any such increase in the barrier layer width reduces the device's radiation hardness, which is inversely related to its thickness.

An improvement upon the detector as described thus far is disclosed in pending U.S. patent application Ser. No. 07/457,613, filed Dec. 27, 1989 by Sato et al., "Dark Current-Free Multiquantum Well Superlattice Infrared Detector", and assigned to Hughes Aircraft Company, the assignee of the present invention. Under this approach the barrier layers 4 are kept thin, but a thicker (generally about 800–3,000 Angstroms) tunneling current blocking layer is provided at the end of the superlattice in the path of the tunneling electrons. The blocking layer 16, which is preferably formed from the same material as the barrier layers 4, eliminates most of the tunneling current component of the photodetector's dark current. This in turn allows the individual barrier layers 4 to be made thinner, thus enhancing the detector's quantum efficiency and increasing its radiation hardness.

The prior MQW superlattice IR detector illustrated in FIG. 1 requires both a relatively large number of quantum well/barrier layer periods, generally 20–30, and a relatively high bias voltage of about 3 volts to obtain sufficiently high quantum efficiency. The large number of superlattice periods can cause detector failure if the detector is operated in a harsh radiation environment. Furthermore, since the number of electrons that are absorbed in the superlattice before reaching the collector contact increases with the initial distance of the electrons from the collector contact, the portions of the superlattice that are distant from the collector contact reduce the overall quantum efficiency. The relatively high bias voltage requirement can lead to a high noise-to-signal ratio and large power consumption.

SUMMARY OF THE INVENTION

The present invention seeks to provide an MQW superlattice radiation detector that is operable with a substantially reduced bias voltage compared to prior detectors, and has a higher quantum efficiency, lower noise level and lower power consumption.

These goals are achieved with a radiation detector in which a plurality of MQW superlattice detectors are structurally formed in a unitary stack, but are electrically connected in parallel. Electrical contact layers are provided between each adjacent pair of superlattices and at opposite ends of the stack, with the adjacent superlattices sharing common contact layers between them. The number of quantum well/barrier layer periods per superlattice can be reduced to about 20–30 divided by the number of superlattices in the stack. This reduces the required bias voltage across the parallel-connected superlattices by a corresponding amount, with an accompanying increase in quantum efficiency and a reduction in noise and power consumption.

The different superlattices can either be similar in structure and composition, or the thickness and composition of their barrier layers can be varied so that the superlattices are sensitive to different radiation wavebands; a multi-color detection system is possible with the latter approach.

These and other features and advantages of the invention will be apparent to those skilled in the art from the following detailed description, taken together with the accompanying drawings, in which:

BRIEF DESCRIPTION OF THE DRAWINGS

FIG. 3 is an energy diagram illustrating the operation of the device shown in FIG. 2a.

DETAILED DESCRIPTION OF THE INVENTION

Figure 1:
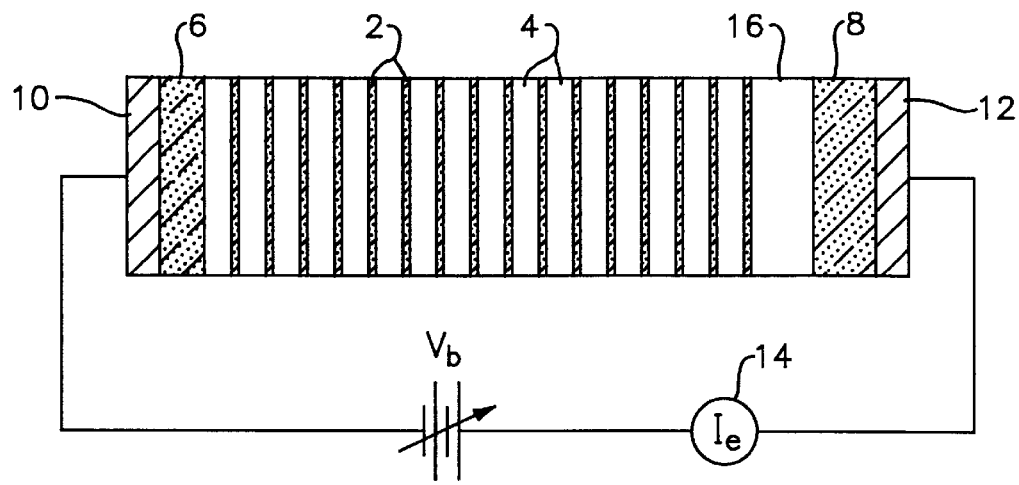
FIG. 1 is a schematic diagram of a prior MQW superlattice radiation detector, discussed above.
Figure 2A:
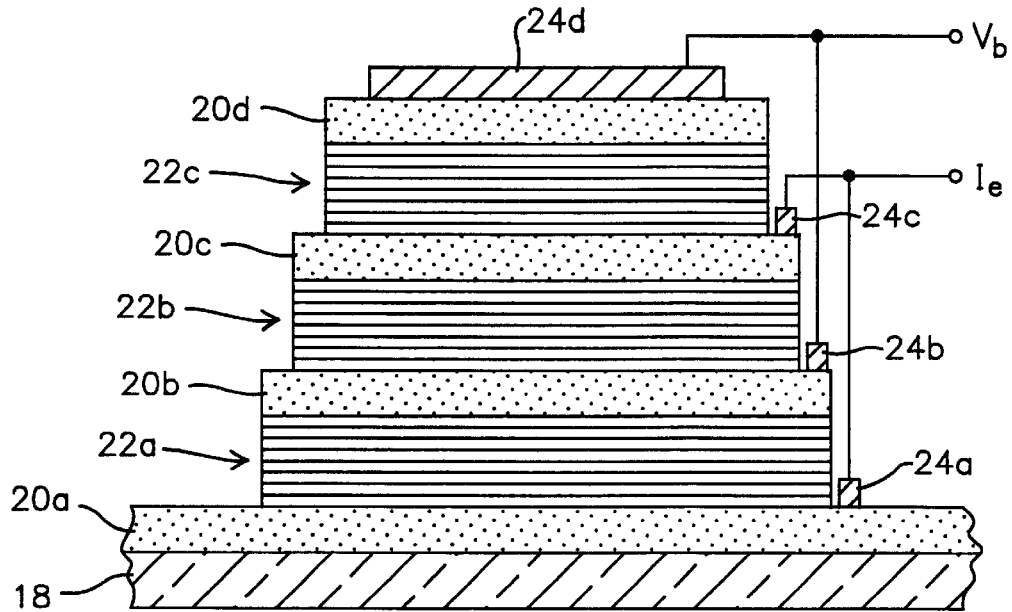
FIGS. 2a and 2b are respectively a sectional view and an electrical schematic diagram showing one embodiment of the invention.

One embodiment of the invention that allows for a significant reduction in bias voltage is illustrated in FIG. 2a. It is fabricated upon a substrate 18 that should be transparent to the radiation waveband of interest. For LWIR GaAs/AlGaAs detectors, substrate 18 is preferably semi-insulating GaAs. An electrical contact layer 20a is formed on the substrate 18, followed in turn by a first MQW superlattice 22a, a second electrical contact layer 20b, a second MQW superlattice 22b, a third electrical contact layer 20c, a third MQW superlattice 22c and finally an upper electrical contact layer 20d. The MQW superlattices 22a–22c can each be similar to the MQW superlattice described in connection with FIG. 1 (except for the number of quantum well/barrier layer periods in each superlattice), while the composition of the contact layers 20a–20d are similar to the contact layers 6 and 8 discussed in connection with FIG. 1.

Each superlattice is stepped back somewhat from its underlying contact layer, leaving room on contact layers 20a, 2b and 2c for ohmic metal contacts 24a, 24b and 24c, respectively. To fully utilize the detector area, the size of the ohmic contacts should be as small as possible. A 24 micron size by the use of via etching and metallization can presently be achieved. An upper ohmic contact 24d is formed over the upper electrical contact layer 20d.

Conventional fabrication methods are preferably employed to manufacture the structure of FIG. 2a as a monolithically integrated stack of MQW superlattices. The various electrical contact layers and superlattices are grown epitaxially from the substrate 18. Molecular beam epitaxy (MBE) is preferably employed for this purpose because it is easy to control the thicknesses of the various layers, and abrupt junctions can be formed between the quantum well and barrier layers in the superlattices. Metal organic chemical vapor deposition (MOCVD) can also be employed, but is not as desirable MBE.

It can be seen from FIG. 2a that each of the MQW superlattices 22a, 22b and 22c has an electrical contact layer on either side. Contact layer 2b is shared by superlattices 22a and 22b, while contact layer 2c is shared by superlattices 22b and 22c. The necessary number of quantum well/barrier layer periods in each superlattice is substantially reduced, compared to prior radiation detector superlattices such as that illustrated in FIG. 1, by establishing connections to the various contact layers so that the superlattices are connected in parallel. This is achieved by connecting a bias voltage source $V_b$ to alternating contact layers 2b and 20d via their respectively ohmic contacts 24b and 24d, and connecting a current output sensor $I_e$ to the intervening contact layers 20a and 2c.

Figure 2B:
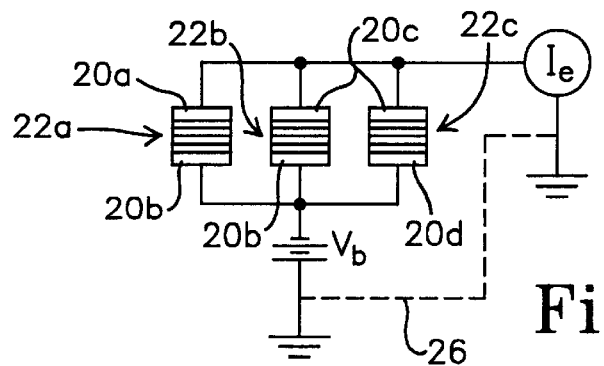

The described connections electrically place the three superlattices in parallel with each other; an equivalent circuit is given in FIG. 2b. Assuming that $V_b$ is a negative bias, contact layer 2b functions as an electron emitter contact for MQW superlattices 22a and 22b, while contact layer 20d functions as an electron emitter contact for superlattice 22c (electrons constitute the majority charge carriers for a superlattice with n-doped quantum wells). On the opposite sides of the superlattices contact layer 20a functions as an electron collector contact for superlattice 22a, while contact layer 2c functions as an electron collector contact for superlattices 22b and 22c. Electron current flows away from contact layer 2b through both superlattices 22a and 22b, while electron current flows away from contact layer 20d through superlattice 22c. The direction of current flow through the superlattices would be reversed if $V_b$ were changed to a positive bias.

As illustrated in FIG. 2b, $V_b$ and $I_e$ can either be connected to ground, or they can be connected together through a lead 26 (shown in dashed lines) to complete the photoexcited electron current circuit. The latter connection is analogous to the circuit connection shown in FIG. 1.

Since the present stacked configuration effectively provides multiple MQW superlattices in parallel, with the photoexcited currents from each superlattice added together, each superlattice requires a smaller number of quantum well/barrier layer periods than with the prior single continuous superlattice. While three superlattices are illustrated, any desired plural number can be employed. In general, the number of periods required for each superlattice is reduced in proportion to the number of superlattices in the stack. With about 20–30 periods for the prior single superlattice, implementing three electrically parallel superlattices as illustrated in FIG. 2a thus reduces the number of periods per superlattice to about 7–10. Since the average distance between the various layers of each stacked superlattice and its collector contact is about one-third that for the prior single superlattice, quantum efficiency is significantly enhanced.

The reduction in the number of superlattice periods in turn leads to a reduction in the required bias voltage, since a smaller bias will produce the same field for a thinner superlattice. Compared to a prior superlattice with the same total number of quantum well/barrier periods, the required bias voltage per superlattice with the present invention is reduced by a factor equal to the number of superlattices in the stack. For the triple superlattice stack of FIG. 2a with about 7–10 periods per superlattice, the required bias voltage is thus reduced from about 3 volts to about 1 volt. This results in better signal-to-noise ratio and lower power consumption.

Figure 3:
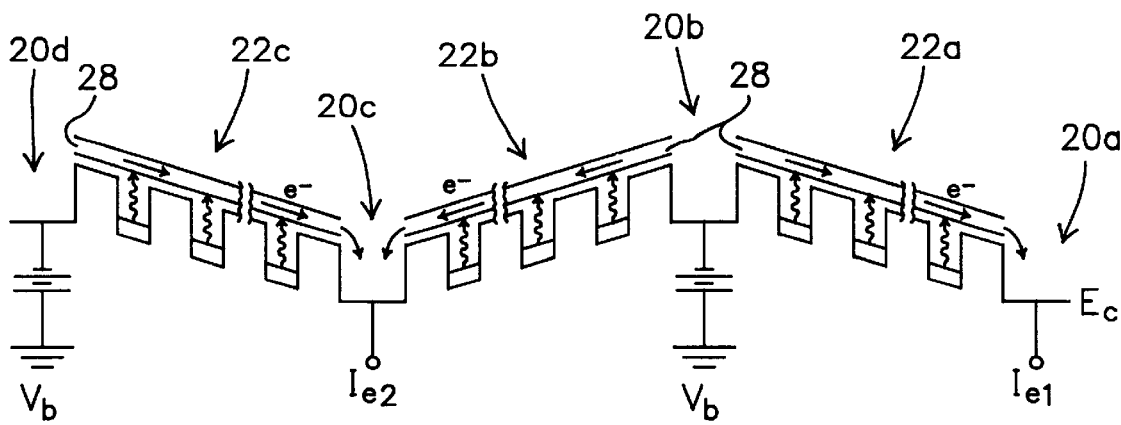

An energy diagram for the stack detector of FIG. 2a is given in FIG. 3, which uses the same reference numerals. Application of the bias voltage $V_b$ elevates the conductive band edge of the immediately adjacent superlattices, creating an electric field through the superlattices to impel photoexcited electrons within a conductive subband 28 toward the nearest collector contact 20a or 2c. There the electrons are collected as current outputs $I_{e1}$ and $I_{e2}$, respectively; the current outputs are added together to provide an indication of the amount of incident radiation within the detector's sensitive waveband.

With the small number of quantum well/barrier layer periods employed for each superlattice, the total thickness of each superlattice can be within the photoexcited electrons' mean free path when a relatively low bias voltage is applied. substantially all photoexcited electrons in the superlattice can thus be collected, leading to an improvement in quantum efficiency. The number of periods, however, should not be so small that the conductive subband energy distribution is affected and is difficult to predict. As stated previously, about 7–10 periods is preferred for each superlattice in a triple stack.

Each of the superlattices 22a, 22b and 22c can be fabricated with materials of similar composition, thickness and number so that each superlattice will respond to the same waveband of incident radiation. Alternately, the thickness and/or composition of the barrier layers could be varied among the different superlattices so that each superlattice or subgroup of superlattices, responds to a different waveband. This would produce a "multi-color" detector, with the current output from each different superlattice or subgroup of superlattices processed separately. The dependence of spectral response upon barrier layer thickness and composition is well known.

Figure 4A:
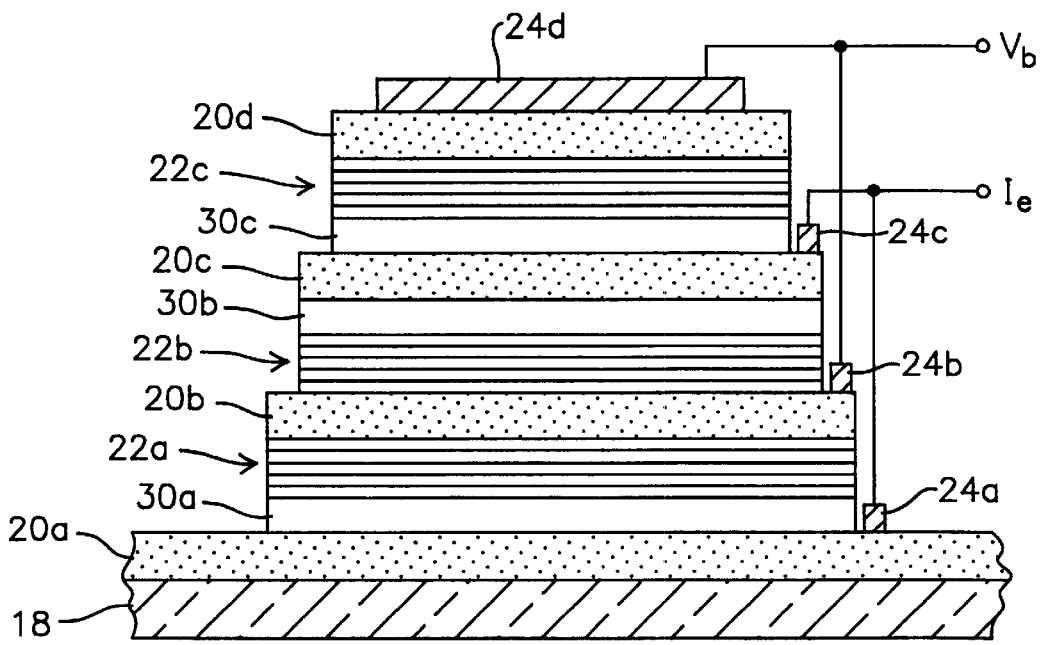
FIGS. 4a and 4b are respectively a sectional view and an electrical schematic diagram of another embodiment of the invention in which tunneling current blocking layers are added to the MQW superlattices.

The invention is also compatible with the tunneling current blocking layer disclosed in Ser. No. 07/457,613. A stacked detector that employs tunneling current blocking layers is illustrated in FIG. 4a, in which the same reference numerals are used for elements that are common with FIG. 2a. Tunneling current blocking layers 30a, 3b and 3c are grown on the output sides of superlattices 22a, 22b and 22c, respectively. The blocking layers are preferably formed from the same material as the barrier layers within the superlattices, and are generally about 800–3,000 Angstroms thick. By eliminating most or all of the tunneling current component of each superlattice's dark current, the blocking layers allow the individual barrier layers within the superlattices to be made thinner, thus further improving the detector's quantum efficiency and increasing its radiation hardness.

Figure 4B:
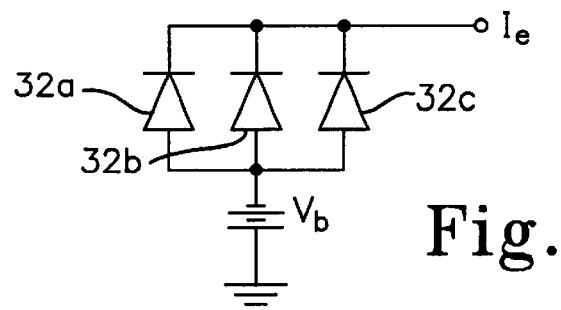

FIG. 4b show an equivalent circuit for the stacked detector of FIG. 4a. The individual superlattices are represented by diodes 32a, 32b and 32c, since the addition of the tunneling current blocking layers in effect makes each detector unidirectional. As with the previous embodiment, the individual detector superlattices are connected in parallel with each other.

Various embodiments of a stacked MQW superlattice radiation detector with improved quantum efficiency, reduced bias voltage requirements, higher signal-to-noise ratio and lower power consumption has thus been shown and described. Numerous variations and alternate embodiments will occur to those skilled in the art. For example, while the invention has been described in terms of GaAs/AlGaAs superlattices with n-doped quantum wells, it is also applicable to superlattices formed from other III–V, IV–IV and II–VI compounds, some of which employ p-doped quantum wells. Accordingly, it is intended that the invention be limited only in terms of the appended claims.

We claim:

1. A radiation detector comprising:
   a plurality of unidirectional radiation detector module, each detector module comprising a multiple quantum well (MOW) superlattice having multiple periods of alternating quantum well and barrier layers, a tunneling current blocking layer at one end of the NOW superlattice, said tunneling currant blocking layer being substantially thicker than any of the superlattice barrier layers, and a pair of contact layers at opposite ends of said MOW superlattice and blocking layer, said radiation detector modules formed on top of one another in a unitary stack,
   means for electrically connecting said radiation detector modules in parallel with each other, and
   means for obtaining outputs from said parallel connected radiation detector modules in response to their detection of incident radiation.

2. The radiation detector of claim 1, said radiation detector modules each including majority charge carrier emitter and collector contact layers at their opposite ends, wherein at least one of said contact layers is shared by radiation detector modules on either side of it.

3. The radiation detector of claim 2, wherein each of said shared contact layers is connected so that excited majority charge carriers from the radiation detector modules on either side of the shared contact layer flow in a common direction with respect to said shared contact layer.

4. The radiation detector of claim 1, said MQW superlattices each comprising multiple periods of alternating quantum well and barrier layers, with the number of periods per superlattice equal to about 20–30 divided by the number of superlattices in the stack.

5. The radiation detector of claim 1, each of said MQW superlattices comprising a series of alternating quantum well and barrier layers of similar composition, thickness and number.

6. The radiation detector of claim 1, each of said MQW superlattices comprising a series of alternating quantum well and barrier layers, with the thickness and/or composition of said barrier layers varying among said superlattices to vary the radiation wavebands to which they are respectively sensitive.

7. A radiation detector, comprising:
   a substrate that is substantially transparent to said radiation,
   a first electrical contact layer on said substrate,
   a first unidirectional radiation detector module that is sensitive to said radiation on said first contact layer, said first radiation detector module comprising a multiple quantum well (WOW) superlattices having multiple periods of alternating quantum well and barrier layers and a tunneling current blocking layer at one end of the MOW superlattice which is substantially thicker than any of the superlattice barrier layers, a second electrical contact layer on the opposite side of said first radiation detractor module from said first contact layer, at least on additional unidirectional radiation detector module of similar construction to said first radiation detector module and associated additional electrical contact layer in a unitary stack over said second contact layer, and means for connecting alternating ones of said electrical contact layers respectively to a bias voltage source and to an output.

8. The radiation detector of claim 7, said MQW superlattices each comprising multiple periods of alternating quantum well and barrier layers, with the number of periods per superlattice equal to about 20–30 divided by the number of superlattices in the stack.

9. The radiation detector of claim 7, each of said MQW superlattices comprising a series of alternating quantum well and barrier layers of similar composition, thickness and number.

10. The radiation detector of claim 7, each of said MQW superlattices comprising a series of alternating quantum well and barrier layers, with the thickness and/or composition of said barrier layers varying among said superlattices to vary the radiation wavebands to which they are respectively sensitive.

11. A radiation detection system, comprising:

a plurality of alternating unidirectional radiation detector modules and electrical contact layers formed in a unitary stack, with electrical contact layers at opposite ends of said stack, said radiation detector modules comprising respective multiple quantum well (MOW) superlattice and respect tunneling current blocking layers at one end of said MOW superlattices, with the relative order of the superlattice and tunneling current blocking layer reversed for each successive radiation detector module, means for applying a bias voltage to alternate ones of said contact layers to urge majority charge carriers from the MOW superlattice for each radiation detector module through its respective tunneling current blocking layer, and means for receiving excited majority charge carrier superlattice outputs from the remainder of said contact layers.

12. The radiation detection system of claim 11, wherein the magnitude of said bias voltage is on the order of 3 volts divided by the number of superlattices in said stack.

13. The radiation detection system of claim 12, said MQW superlattices each comprising multiple periods of alternating quantum well and barrier layers, with the number of periods per superlattice equal to about 20–30 divided by the number of superlattices.

14. The radiation detector of claim 1, said means for electrically connecting said radiation detector modules in parallel with each other comprising a first connector connected to the contact layer on the MQW superlattice side of each radiation detector nodule, and a second connector connected to the contact layer on the tunneling current blocking layer side of each radiation detector module.

15. The radiation detector of claim 14, wherein successive radiation detector modules share common contact layers between them.

16. The radiation detector of claim 15, wherein the relative positions of the MQW superlattice and tunneling current blocking layers are reversed for each successive radiation detector module, with every other contact layer interfacing with the MQW superlattices of its adjacent radiation detector modules, and the intervening contact layers interfacing with the tunneling current blocking layers of their respective adjacent radiation detector modules.

17. The radiation detector of claim 16, said means for obtaining outputs from said parallel connected radiation detector modules including means for applying voltage biases across said modules that urge majority charge carriers from their respective MQW superlattices through their respective tunneling current blocking layers.

18. The radiation detector of claim 7, wherein said radiation detector modules are arranged so that every other contact layer interfaces with the MQW superlattices of its adjacent radiation detector modules, and each intervening contact layer interfaces with the tunneling current blocking layers of its adjacent radiation detector modules.

19. The radiation detector of claim 18, wherein said connecting means connects alternating ones of said electrical contact layers to a bias voltage source, the polarity of said bias voltage source urging majority charge carriers to flow from said MQW superlattices, through their respective tunneling current blocking layers.

* * * * *